US005795811A

United States Patent [19]

Kim et al.

[11] Patent Number: 5,795,811
[45] Date of Patent: Aug. 18, 1998

[54] METHOD FOR FORMING INSULATING FILMS IN SEMICONDUCTOR DEVICES

[75] Inventors: Chang-gyu Kim; Woo-in Chung, both of Suwon, Rep. of Korea

[73] Assignee: Samsung Electronics Co., Ltd., Suwon, Rep. of Korea

[21] Appl. No.: 578,921

[22] Filed: Dec. 27, 1995

[30] Foreign Application Priority Data

May 30, 1995 [KR] Rep. of Korea ............. 95-13955

[51] Int. Cl.⁶ ................................................ H01L 21/76
[52] U.S. Cl. ........................ 438/404; 438/424; 438/435
[58] Field of Search ........................... 437/62, 67, 238; 438/404, 424, 435, 437, 787, 790

[56] References Cited

U.S. PATENT DOCUMENTS

| | | | |
|---|---|---|---|
| 4,534,824 | 8/1985 | Chen | 437/67 |
| 4,551,911 | 11/1985 | Sasaki et al. | 29/576 W |
| 4,666,557 | 5/1987 | Collins et al. | 156/643 |
| 4,707,218 | 11/1987 | Giammarco et al. | 156/643 |
| 4,871,630 | 10/1989 | Giammarco et al. | 430/14 |
| 5,008,210 | 4/1991 | Chiang et al. | 437/33 |
| 5,068,202 | 11/1991 | Crotti et al. | 437/67 |
| 5,296,092 | 3/1994 | Kim | 156/643 |
| 5,356,722 | 10/1994 | Nguyen et al. | 427/569 |
| 5,387,540 | 2/1995 | Poon et al. | 437/67 |
| 5,399,389 | 3/1995 | Hieber et al. | 437/238 |
| 5,399,520 | 3/1995 | Jang | 437/67 |
| 5,406,111 | 4/1995 | Sun | 257/497 |
| 5,416,041 | 5/1995 | Schwalks | 437/62 |
| 5,424,240 | 6/1995 | Han | 437/67 |
| 5,436,488 | 7/1995 | Poon et al. | 257/397 |
| 5,447,884 | 9/1995 | Fahey et al. | 437/67 |
| 5,498,565 | 3/1996 | Gocho et al. | 437/67 |
| 5,518,959 | 5/1996 | Jang et al. | 437/238 |
| 5,536,681 | 7/1996 | Jang et al. | 437/238 |
| 5,552,344 | 9/1996 | Jang et al. | 437/195 |
| 5,563,104 | 10/1996 | Jang et al. | 437/238 |
| 5,576,576 | 11/1996 | Hawley et al. | 257/530 |
| 5,599,740 | 2/1997 | Jang et al. | 437/238 |
| 5,643,822 | 7/1997 | Furukawa et al. | 437/67 |

FOREIGN PATENT DOCUMENTS

| | | |
|---|---|---|
| 2094630 | 4/1990 | Japan . |
| 3-198339 | 8/1991 | Japan . |

Primary Examiner—Chandra Chaudhari
Assistant Examiner—Matthew Whipple
Attorney, Agent, or Firm—Myers Bigel Sibley & Sajovec

[57] ABSTRACT

A method of forming an isolating trench device in a semiconductor device comprising the steps of; sequentially forming a first material layer and a second material layer over a surface of a semiconductor substrate, exposing a portion of the semiconductor substrate in which a device isolation region is to be formed by selectively etching the first and second material layers, forming side wall spacers on exposed lateral sidewalls of the first and second material layers, forming a trench by etching the exposed portion of the semiconductor substrate using the side wall spacers as a mask, depositing an insulating film having an underlayer dependency characteristic over the surface of the resulting structure, etching the surface of the insulating film, and removing the first and second material layers.

15 Claims, 3 Drawing Sheets

METHOD FOR FORMING INSULATING FILMS IN SEMICONDUCTOR DEVICES

BACKGROUND OF THE INVENTION

The present invention relates to a method for forming an insulating film in a semiconductor device. More particularly, the present invention relates to a method for selectively forming an insulating film in a semiconductor device without generating a void between adjacent wiring layers or between adjacent devices.

As semiconductor devices become more highly integrated and as wiring structures within the semiconductor devices become multilayered, the spacing (or interval) between adjacent devices or wiring layers becomes increasingly small. Accordingly, planarization techniques for highly integrated patterns having features with high aspect ratios pose an increasing challenge. Particularly, a method which can selectively form an insulating film without generating a void in an isolation region between adjacent wiring such as gate lines, bit lines, or metal lines, or between adjacent devices is very desirable.

In general, an ozone-tetraethylorthosilicate undoped silicate glass ($O_3$-TEOS USG) film has a characteristic wherein its deposition rate varies according to the surface characteristic of the deposition underlayer. This dependency on the underlayer is greatest upon the initial deposition of the $O_3$-TEOS USG film. The effect on this underlayer dependency is reduced as the accumulated thickness of the $O_3$-TEOS USG film increases.

SUMMARY OF THE INVENTION

The present invention provides a method for selectively forming an insulating film in a semiconductor device without generating a void between adjacent wiring structures or adjacent devices. The present invention also provides a method for forming an isolated trench device in a semiconductor device, wherein the isolated trench device is selectively formed, without generating a void between wiring structure or devices.

To accomplish the foregoing, the present invention provides in one aspect a method of forming an insulating film in a semiconductor device, comprising the steps of:

(a) forming at least one material layer over a semiconductor substrate;

(b) exposing a portion of the semiconductor substrate by selectively etching the at least one material layer;

(c) depositing an insulating film having an underlayer dependency characteristic over the surface of the structure resulting from step (b); and, (d) etching the surface of the insulating film.

The at least one material layer is preferably formed from a material which reduces a deposition rate for the insulating film, as compared to a deposition rate for the insulating film over the semiconductor substrate, such as high-temperature oxide (HTO), PE-oxide, thermal oxide, PSG and BPSG.

The insulating film is preferably formed of $O_3$-TEOS USG or $O_3$-HMDS USG.

In another aspect, the present invention comprises a method of forming an isolating trench device in a semiconductor device comprising the steps of:

(a) sequentially forming a first material layer and a second material layer over a surface of a semiconductor substrate;

(b) exposing a portion of the semiconductor substrate in which a device isolation region is to be formed by selectively etching the first and second material layers;

(c) forming side wall spacers on exposed lateral sidewalls of the first and second material layers resulting from step (b);

(d) forming a trench by etching the exposed portion of the semiconductor substrate using the side wall spacers as a mask;

(e) depositing an insulating film having an underlayer dependency characteristic over the surface of the structure resulting from step (d);

(f) etching the surface of the insulating film; and (g) removing the first and second material layers.

The first and second material layers and the side wall spacers are preferably formed from a material which reduces a deposition rate for the insulating film, as compared to a deposition rate for the insulating film over the semiconductor substrate, such as high-temperature oxide (HTO), PE-oxide, thermal oxide, PSG or BPSG.

Again, the insulating film comprises $O_3$-TEOS USG or $O_3$-HMDS USG.

Step (f) may comprise the step of performing a chemical mechanical polishing (CMP) process on the surface of the first material layer.

Finally, the foregoing method may include the step of wet oxidizing the surface of the structure resulting from step (e) before performing step (f).

BRIEF DESCRIPTION OF THE DRAWINGS

The advantages of the present invention will become more apparent upon consideration of a preferred embodiment with reference to the attached drawings in which.

DETAILED DESCRIPTION OF THE INVENTION

Figure 1A:
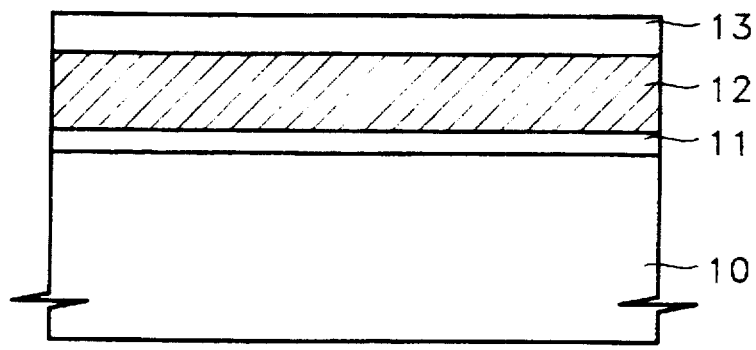
FIGS. 1A through 1G are sectional views illustrating a method for forming an insulating film in a semiconductor device according to the present invention.

FIG. 1A shows the steps of forming a first material layer 12 and a second material layer 13 over a pad oxide film 11 of approximately 240 Å thickness covering a silicon substrate 10. The pad oxide film 11 is formed by thermal oxidation. First material layer 12 is preferably silicon nitride deposited on the pad oxide film 11 to a thickness of approximately 1500 Å. Pad oxide film 11 serves to alleviate stress on substrate 10 otherwise caused by first material layer 12. Second material layer 13 is subsequently formed of a material which lowers the deposition rate of a film having the underlayer dependency characteristic. For example, second material layer 13 may be formed of a high-temperature oxide deposited on the first material layer 12 to a thickness of approximately 1000 Å. More particularly, the material from which second material layer 13 is preferably one selected from a group consisting of high-temperature oxide, PE-oxide, thermal oxide, PSG, and BPSG.

Figure 1B:
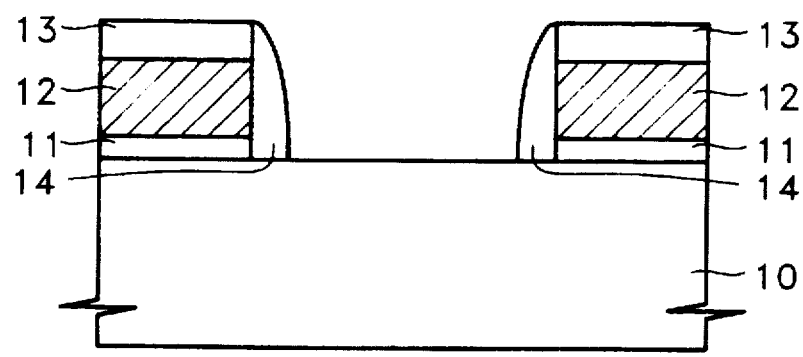

FIG. 1B shows the step of forming side wall spacers 14. Second material layer 13, first material layer 12 and pad oxide film 11 are sequentially etched by photolithography, to thereby expose a portion substrate 10, wherein a device isolation region is to be formed. Subsequently, a material for lowering the deposition rate of a film having the underlayer dependency characteristic, for example, high-temperature oxide, is deposited over the entire surface to a thickness of approximately 500 Å. This high-temperature oxide layer is then anisotropically etched to form side wall spacers 14 covering the sidewalls of second and first material layers 13, 12 and pad oxide film 11.

Figure 1C:
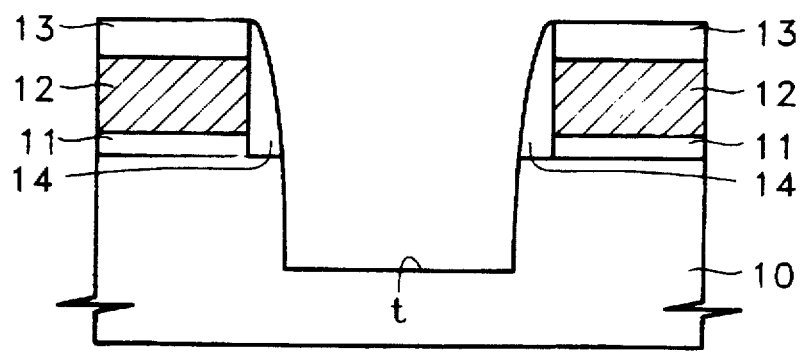

FIG. 1C shows the step of forming a trench (t). The portion of substrate 10 exposed between side wall spacers 14 is etched using side wall spacers 14 as an etching mask to thereby form a trench (t) in a region where device isolation is to be performed. As a result, second material layer 13 which lowers the deposition rate of a film having the underlayer dependency characteristic is exposed in active region(s) of the resulting structure while a portion of the substrate 10 which increases the deposition rate of a film having the underlayer dependency characteristic is exposed in the device isolation region.

Figure 1D:
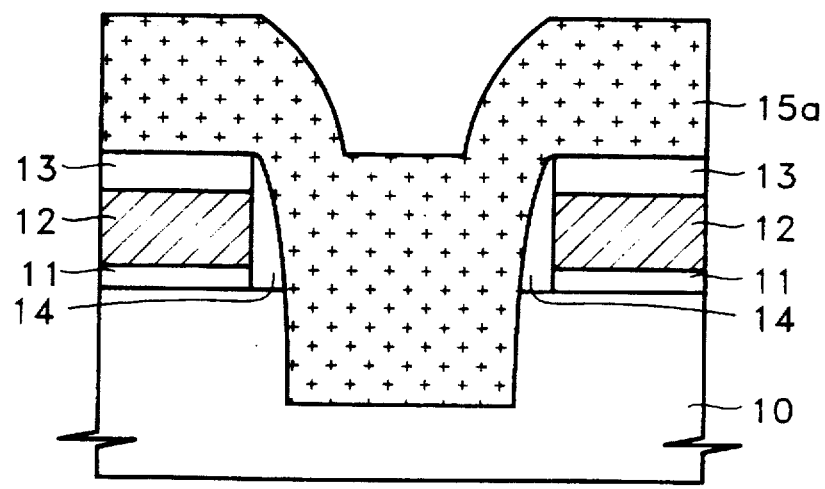

FIG. 1D shows the step of forming a first insulating film 15a. A material having the underlayer dependency characteristic, for example, $O_3$-TEOS USG, is deposited over the entire surface of the resultant structure to a thickness of approximately 6000 Å using an exposed wafer as a reference. As a result, in the active region(s), that is, in a region where second material layer 13 was exposed, the first insulating film 15a is formed to a thickness of approximately 3000 Å. In the device isolation region, where the substrate 10 was exposed, first insulating film 15a is formed to a thickness of approximately 6000 Å.

Figure 1E:
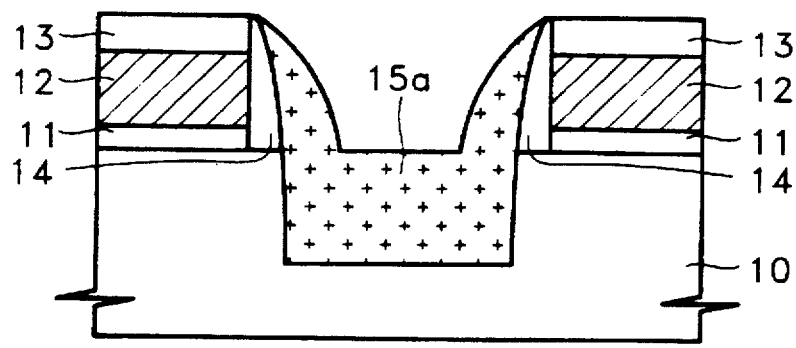

FIG. 1E shows the step of etching the surface of first insulating film 15a. By dry-etching, i.e., by etching-back, the surface of first insulating film 15a, second material layer 13 overlaying the active region(s) is again exposed, while a portion of first insulating film 15a approximately 3000 Å thick remains in the device isolation region. Here, when first insulating film 15a formed of $O_3$-TEOS USG, for example, is dry-etched, the remaining surface of first insulating layer 15a no longer has the underlayer dependency characteristic, due to a change in the surface condition of the first insulting layer 15a during etching. However, the underlayer dependency characteristic can be recovered by dipping the damaged surface of the first insulting layer 15a into 200:1 HF for about 120 seconds. Here, it is possible to also remove, or partially remove first material layer 12 using a chemical-mechanical polishing method to remove the upper (active region overlaying) portion of first insulting layer 15a.

Figure 1F:
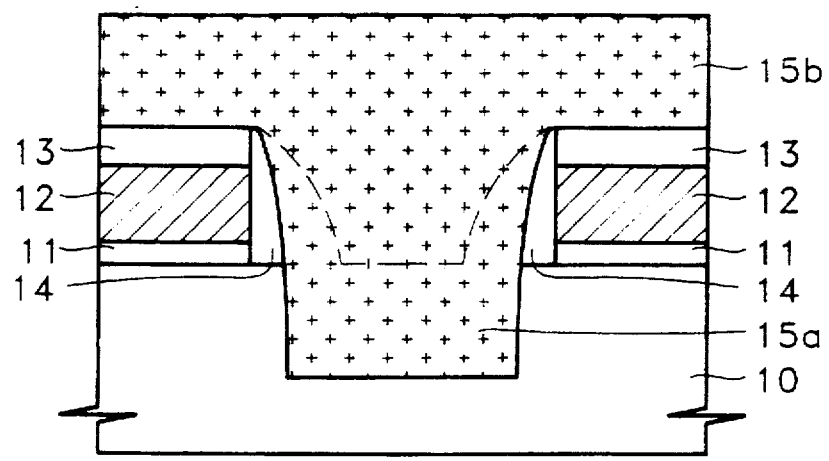

FIG. 1F shows the step of forming a second insulating film 15b. A material having the underlayer dependency characteristic, for example, $O_3$-TEOS USG, is deposited to a thickness of approximately 6000 Å over the surface of the resultant structure in which second material layer 13 overlaying the active region(s) has been exposed by etching the surface of first insulating film 15a to thereby form second insulating film 15b.

Figure 1G:
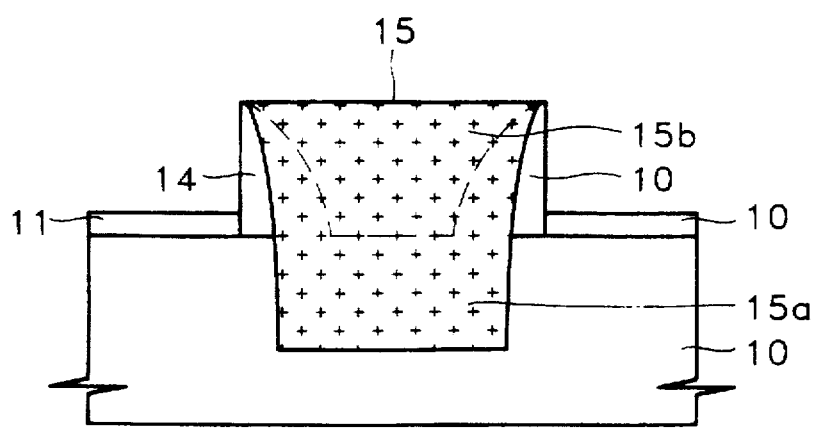

FIG. 1G shows the step(s) of forming an isolation region 15. First, the surface of the resultant structure following deposition of the second insulating film 15b is heat-treated under a nitrogen ($N_2$) atmosphere at a temperature of approximately 850° C. for about 30 minutes. Then, second insulating film 15b is etched to a depth of approximately 4000 Å. During this step, second material layer 13 may also be etched away. Subsequently, first material layer 12 overlaying the active region(s) is removed to yield a trench isolation structure 15 comprising first and second insulating layers 15a and 15b. (The junction of first and second insulating layers 15a and 15b is shown by the dotted line in FIGS 1F and 1G).

Once second insulating film 15b has been etched, and in order to reduce leakage current, the surface of the silicon substrate may be conditioned using a wet oxidation process, for example.

Thus, in a method for forming an insulating film in a semiconductor device according to the present invention as described above, an underlayer is selectively exposed and an insulating film having the underlayer dependency characteristic is deposited such that a relatively thick insulating film may be formed without a void between adjacent wiring structures or adjacent devices. The foregoing method may also be adapted to the formation of an isolating trench structure in a semiconductor device.

The foregoing embodiment is given by way of example. The present invention is not limited to the disclosed embodiment, but taught by it. Modifications and alterations will occur to one of ordinary skill in the art upon consideration of these teachings. For example, should the insulating film formed by the embodiment be insufficiently thick for a particular application, repeated deposition and etching of the insulting film surface may be performed.

The present invention is defined by the appended claims in which respective steps are lettered for ease of reference. The lettering of the respective method steps is not limiting as to the sequence or composition of the claimed method.

What is claimed is:

1. A method of forming an isolating trench device in a semiconductor device comprising the steps of:

(a) sequentially forming a first material layer and a second material layer over a surface of a semiconductor substrate;

(b) exposing a portion of the semiconductor substrate in which a device isolation region is to be formed by selectively etching the first and second material layers;

(c) forming side wall spacers on exposed lateral sidewalls of the first and second material layers resulting from step (b);

(d) forming a trench by etching the exposed portion of the semiconductor substrate using the side wall spacers as a mask;

(e) depositing an insulating film having an underlayer dependency characteristic over the surface of the structure resulting from step (d);

(f) etching the surface of the insulating film; and (g) removing the first and second material layers.

2. The method of claim 1, wherein the first and second material layers and the side wall spacers are formed from a material which reduces a deposition rate for the insulating film, as compared to a deposition rate for the insulating film over the semiconductor substrate.

3. The method of claim 2, wherein the first and second material layers and the side wall spacers are formed from one selected from a group consisting of high-temperature oxide (HTO), PE-oxide, thermal oxide, PSG and BPSG.

4. The method of claim 1, wherein the insulating film comprises one selected from a group consisting of $O_3$-TEOS USG and $O_3$-HMDS USG.

5. The method of claim 1, further comprising the steps of:

(h) depositing an additional insulating film having the underlayer dependency characteristic over the surface of the insulating film following step (f); and, (i) etching the surface of the additional insulating film.

6. The method of claim 5, wherein steps (h) and (i) are repeated until such time as an insulating structure having a desired thickness is obtained.

7. The method of 1, wherein the step (f) comprises the step of performing a chemical mechanical polishing (CMP) process on the surface of the first material layer.

8. The method of claim 1, further comprising step of:

(j) wet oxidizing the surface of the structure resulting from step (f).

9. A method of forming an isolation trench in an integrated circuit substrate, comprising the steps of:

forming on an integrated circuit substrate, a mask including an opening therein that defines a mask side wall and a side wall spacer on the mask side wall;

etching the integrated circuit substrate using the mask and side wall spacer as an etching mask to thereby form a trench in the integrated circuit substrate;

forming an insulating film having an underlayer dependency characteristic, in the trench, on the side wall spacer and on the mask; and etching the insulating film.

10. A method according to claim 9 wherein the mask and side wall spacer comprise material that reduces a formation rate for the insulating film thereon, compared to a formation rate for the insulating film on the integrated circuit substrate.

11. A method according to claim 9 wherein the mask and the side wall spacer comprise material selected from the group consisting of high-temperature oxide (HTO), PE-oxide, thermal oxide, PSG and BPSG.

12. A method according to claim 11 wherein the insulating film comprises material selected from the group consisting of $O_3$-TEOS USG and $O_3$-HMDS USG.

13. A method according to claim 9 wherein the step of etching the insulating film comprises the step of:

etching the insulating film from the mask, such that the insulating film remains on the side wall spacer and in the trench.

14. A method according to claim 13 wherein the step of etching the insulating film is followed by the steps of:

forming a second insulating film having an underlayer dependency characteristic on the insulating film and on the mask; and etching the second insulating film.

15. A method according to claim 13 wherein the etching step comprises the step of chemical-mechanical polishing the insulating film from the mask, such that the insulating film remains on the side wall spacer and in the trench.

* * * * *